(12) United States Patent
Czerwieniec et al.

(10) Patent No.: US 9,059,415 B2
(45) Date of Patent: Jun. 16, 2015

(54) USE OF GOLD COMPLEXES IN OPTOELECTRONIC DEVICES

(75) Inventors: Rafal Czerwieniec, Regensburg (DE); Hartmut Yersin, Sinzing (DE); Uwe Monkowius, Linz (AT); Thomas Hofbeck, Freystadt (DE); Antonio Laguna, Zaragoza (ES); Olga Crespo, Zaragoza (ES); Maria Conception Gimeno, Zaragoza (ES)

(73) Assignee: Cynora GmbH, Bruchsal (DE)

( * ) Notice: Subject to any disclaimer, the term of this patent is extended or adjusted under 35 U.S.C. 154(b) by 297 days.

(21) Appl. No.: 13/578,373

(22) PCT Filed: Feb. 10, 2011

(86) PCT No.: PCT/EP2011/051965
§ 371 (c)(1),
(2), (4) Date: Nov. 27, 2012

(87) PCT Pub. No.: WO2011/098522
PCT Pub. Date: Aug. 18, 2011

(65) Prior Publication Data
US 2013/0066092 A1 Mar. 14, 2013

(30) Foreign Application Priority Data
Feb. 11, 2010 (DE) .......................... 10 2010 007 825

(51) Int. Cl.
C07F 1/12 (2006.01)
C07F 9/6596 (2006.01)
H01L 51/00 (2006.01)
C09K 11/06 (2006.01)
H05B 33/14 (2006.01)
H01L 51/05 (2006.01)
H01L 51/42 (2006.01)
H01L 51/50 (2006.01)
H01S 5/36 (2006.01)

(52) U.S. Cl.
CPC ............ H01L 51/0091 (2013.01); C09K 11/06 (2013.01); C09K 2211/188 (2013.01); H01L 51/008 (2013.01); H01L 51/0081 (2013.01); H01L 51/009 (2013.01); H01L 51/0545 (2013.01); H01L 51/42 (2013.01); H01L 51/5012 (2013.01); H01L 2251/308 (2013.01); H01S 5/36 (2013.01); H05B 33/14 (2013.01); Y02E 10/549 (2013.01)

(58) Field of Classification Search
CPC ..... H01L 51/008; H01L 51/0091; C07F 1/12; H05B 33/14; C09K 11/06
USPC .............................. 556/7, 18; 257/40; 438/46
See application file for complete search history.

(56) References Cited

FOREIGN PATENT DOCUMENTS

| DE | 102008033563 A1 | 1/2010 |
| EP | 2088151 A1 | 8/2009 |

OTHER PUBLICATIONS

EPO International Search Report and Written Opinion of the International Searching Authority for PCT/EP11/51965 mailed Apr. 14, 2011 (9 pages).
Crespo, Olga et al., "Luminescent nido-Carborane-Diphosphine Anions", 2003 Inorganic Chemistry, vol. 42, No. 6 (pp. 2061-2068).
Pankaj, Sinha et al., "Beyond a T-Shape", 2005 Amer. Chem. Soc., vol. 127 (pp. 12488-12489).

*Primary Examiner* — Porfirio Nazario Gonzalez
(74) *Attorney, Agent, or Firm* — Harris Beach PLLC

(57) ABSTRACT

The invention relates to gold(I) complexes having a planar-trigonal coordination geometry and multivalent ligands for use in an optoelectronic device, in particular in organic light-emitting diodes (OLEDs) and in light-emitting electrochemical cells (LEECs).

20 Claims, 5 Drawing Sheets

[Au(dipnc)(PPh₃)]

[Au(dppnc)(PPh₃)]

Figure 1

| | |
|---|---|
| Cathode: Al | 200 nm |
| Interlayer: LiF | 0.8 nm |
| Electron transport layer ETL: Alq$_3$ | 40 nm |
| Emitter layer EML<br>12 % emitter material | 20 nm |
| Hole transport layer HTL | 30 nm |
| Hole injection layer HIL | 10 nm |
| Anode ITO | 40 nm |
| Support material glas | |

USE OF GOLD COMPLEXES IN OPTOELECTRONIC DEVICES

CROSS-REFERENCE TO RELATED APPLICATIONS

This application is a national stage application under 35 U.S.C. §371 of PCT Application No. PCT/EP2011/051965, filed Feb. 10, 2011, which claims priority to and the benefit of German Application No. DE 10 2010 007 825.5, filed Feb. 11, 2010, which is incorporated herein by reference in its entirety.

INTRODUCTION

The present invention relates to the use of gold(I) complexes having a planar-trigonal coordination geometry and multivalent ligands in optoelectronic devices.

A drastic change in the area of display-screen and lighting technology is currently becoming apparent. It will be possible to manufacture flat displays of lighting areas having a thickness of less than 0.5 mm. These are characterized by many fascinating properties. Thus, for example, lighting areas can be produced as wallpapers with very low energy consumption. Particularly interesting is also that it will be possible to produce color display screens having hitherto unachievable color fidelity, brightness and viewing-angle independence, with low weight and very low energy consumption. The display screens can be designed as micro displays or large display screens having an area of several square meters in rigid of flexible form, but also as transmission or reflection displays. It will furthermore be possible to employ simple and cost-saving production processes, such as screen-printing, ink-jet printing, or vacuum sublimation. Inexpensive manufacture is thus facilitated compared to conventional flat display screens. This novel technology is based on the principle of OLEDS, organic light-emitting diodes.

OLEDs consist predominantly of organic layers, which are also flexible and inexpensive to manufacture. OLED components can be designed with large areas as lighting units, but also in small form as pixels for displays.

Compared to conventional technologies such as liquid-crystal displays (LCDs), plasma-displays or cathode ray tubes (CRTs), OLEDs have numerous advantages, such as a low operating voltage, a thin structure, highly efficiently self-illuminating pixels, high contrast and good resolution, as well as the possibility to display all colors. Furthermore, an OLED emits light on application of an electrical voltage instead of only modulating it.

An overview of the function of OLEDs is given, for example, in H. Yersin, *Top. Curr. Chem.* 2004, 241, 1 and H. Yersin, "Highly Efficient OLEDs with Phosphorescent Materials", Wiley-VCH, Weinheim, Germany, 2008.

Since the first reports of OLEDs (for example Tang et al., *Appl. Phys. Lett.* 1987, 51 913) these devices have been developed further, in particular with respect to the emitter materials employed, wherein so-called triplet emitters or also other phosphorescent emitters are of particular interest.

The crucial factor for the construction of highly effective OLEDs is the light-emitting materials (emitter molecules) used. These can be produced in various ways, using purely organic molecules or organometallic complex compounds. It can be shown that the light yield of OLEDs comprising organometallic substances, so-called triplet emitters, can be significantly greater than for purely organic materials. Due to this, the further development of organometallic material is of great importance.

Particularly high efficiency of the device can be achieved using organometallic complexes having a high emission quantum yield (emission from the lowest triplet states to the singlet ground states). Such materials are frequently known as triplet emitters or phosphorescent emitters.

It is known that gold(I) complexes with planar-trigonal coordination geometry and monodentate ligands exhibit photoluminescence. However, such complexes change in geometry, which has—as described further below—a very disadvantageous impact on the emitter substance. However, such complexes undergo changes in geometry during the transition from the ground state to the excited state, which is responsible for the emission. As a result, these complexes do not possess a sufficiently high emission quantum yield. Due to the severe changes in geometry, the photochemical stability is also reduced. Consequently, the known complexes are hardly suitable for the use in optoelectronic devices, i.e. especially OLEDs.

Whereas numerous applications have already been implemented for OLEDs and new areas of application have also been opened up, there is still a demand for improved OLEDs and in particular for improved triplet emitter materials. With the emitters of the state of the art, high efficiencies at high current densities and high light densities often cannot be reached.

An object of the present invention was therefore to provide novel emitter materials, in particular for OLEDs, and novel light-emitting devices and other optoelectronic applications, which at least partially overcome the disadvantages of the prior art.

DESCRIPTION

This object is reached by the present invention.

Detailed analyses surprisingly showed that certain gold(I) complexes described herein are particularly suitable for the use as triplet emitters in OLEDs, LEECs and other optoelectronic devices.

Accordance to the invention, the compounds according to formula I are used as triplet emitters in optoelectronic devices:

$$[(L\text{-}L)(L')Au]^{0/1+}[Anion]_{0/1} \qquad \text{Formula (I)}$$

in which:

(L-L) and (L') are ligands,

Au is a Au$^+$ center ion and

Anion is an anion, which is present, if (L-L) and (L') are neutral, since the complex is then positively charged, i.e. $[(L\text{-}L)(L')Au]^{1+}$.

Depending upon the selection of the ligands (L-L) and (L') a charged complex (charge +1, one anion) or a neutral complex (charge=, no anion) is formed.

L-L is a bidentate ligand, whereas L' is a monodentate or a bidentate (bridging) ligand.

The compounds of the invention are also referred to as "gold complexes". This term may comprise besides the actual complex also the anion where applicable and may therefore refer to a complex salt.

Formula (I) comprises the following groups and subgroups of trigonal compounds, which, within preferred embodiments of the invention, can be used as emitters or absorbers in optoelectronic devices:

Group A: Charged Complexes of Formula (II)

$$[(L\text{-}L)(L')Au]^{1+}[\text{Anion}] \qquad \text{Formula (II)}$$

Subgroup A1: (L-L) is a neutral, bidentate ligand, L' is also a neutral bidentate ligand: due to the fact that L' is bidentate, the empiric formula $[(L\text{-}L)(L')_{0.5}Au]^{1+}$ [Anion] results.

Subgroup A2: (L-L) is a neutral, bidentate ligand, L' is a neutral, monodentate ligand: This results in the empiric formula $[(L\text{-}L)(L')Au]^{1+}$[Anion].

Subgroup A3: L' is bound to (L-L) and forms a neutral, tridentate ligand (L-L-L'): This results in the empiric formula $[(L\text{-}L\text{-}L')Au]^{1+}$[Anion].

Group B: Neutral Complexes of Formula (III)

$$[(L\text{-}L)(L')Au] \qquad \text{Formula (III)}$$

Subgroup B1: (L-L) is a neutral, bidentate ligand, L' is a monoanionic monodentate ligand: This results in the empiric formula [(L-L)(L')Au].

Subgroup B2: (L-L) is a monoanionic, bidentate ligand, L' is a neutral, monodentate ligand: This results in the empiric formula [(L-L)(L')Au].

Subgroup B3: L' is additionally bound to (L-L) and forms a singly negatively charged, tridentate ligand (L-L-L'): This results in the empiric formula [(L-L-L')Au].

Preferred is the presence of multidentate ligands, which lead to a stiffening of the gold complexes. This applies to bridging, but particularly to the preferred chelating bonding patterns. Because of the increased rigidity of the system, the geometric distortion during the transition from the ground state to the excited state is reduced (change from the trigonal-planar coordination in the direction of T-shaped coordination). Hereby, the emission quantum yields rise significantly, since thermal relaxation processes are hindered. Moreover, the Stokes-shift is reduced significantly. This leads to increased energy efficiency in the optoelectronic device, which is very advantageous for optoelectronic applications.

Moreover the stability of the complexes increases with multidentate ligands, which leads to an extension of the lifetime of the respective optoelectronic device.

Regarding the ligands, the emission wavelength can be regulated not only by the type of the ligands L-L and L', but also by their sterical demand. In general, ligands with high sterical demand exhibit higher emission energy than complexes with smaller ligands, because of the resulting limited possibility of distortion in the excited state and therefore smaller Stokes-shift. For bridging bonding patterns, a coordination polymer or rings may be formed. Bridging bonding patterns are coordination geometries in which a multidentate ligand does not act as a chelate ligand, but connects two or more metal atoms. In this case, the rigidity and stability is also increased in comparison to complexes with only monodentate ligands. In case of monomeric complexes, the complexes can be bound to polymers via appropriate functionalization of the ligands. Three functionalized phosphine ligands, which can be easily incorporated into polymers, are shown as examples:

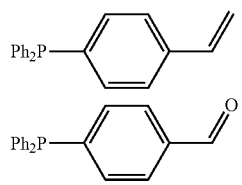

The vinyl-substituted phosphine can easily be copolymerized with other momoners (for example styrene) using well-established polymerization methods (anionic, cationic, radical, catalytic) or be attached as side chain to an existing polymer. The bromine and aldehyde substituted phosphines can be attached as side chains to an appropriately functionalized polymer via coupling reactions (for example, Suzuki, Wittig).

Another important advantage of complexes with high sterical demand is that the emitting centers exhibit less interactions. Thereby, emission self-quenching processes due to triplet-triplet annihilation are reduced. Due to this, such materials (complexes) can be used in higher concentrations in the emitter layers of OLEDs. This causes, as shown below, a high emission quantum yield appears even in solid matter (100% emitter material). For example measured at 300 K, the emission quantum yield for 100% [Au(dipnc)(PPh$_3$)] is just as the emission quantum yield in a PMMA film with a complex concentration of about one weight percent (70±15) %. The outcome of this is that OLED devices with comparably high efficiency can be operated at higher current densities and therefore higher brightness. By those skilled in the art, this is referred to as a lower roll-off behavior.

Preferred embodiments of complexes of the general formula (I) are described in detail below.

Group A: Charged Complexes of Formula (II)

The ligands L-L and L' may preferably be phosphines, arsines, isonitriles, thioethers or selenoethers. For the sake of a simple synthetic route, the use of identical ligands is advantageous. The preferred anions are weakly coordinating ones, such as for example $BF_4^-$, $PF_6^-$, $SbF_6^-$, $NO_3^-$, and $ClO_4^-$.

Subgroup A1:

This subgroup according to the definition above refers to either bimetallic or polymer structures. Those bimetallic compounds are preferred, which have no metal-metal interactions, i.e. no direct Au—Au interactions Therefore it is necessary, that the bridging group of the bidentate ligand L-L is either rigid, such as being achievable by the use of cyclic bridges, or long.

Particularly preferred ligands are bisphosphines and bisarsines such as: $R_2P(CH_2)_nPR_2$, $R_2As(CH_2)_nAsR_2$ (n=1-20, preferably n=3, 4, 5).

Complexes in which L-L=L' are also preferred. This results in the empirical formula $[(L\text{-}L)_{1.5}Au]^{1+}$[anion]. In the following depictions, only the cations are shown, but not the anion.

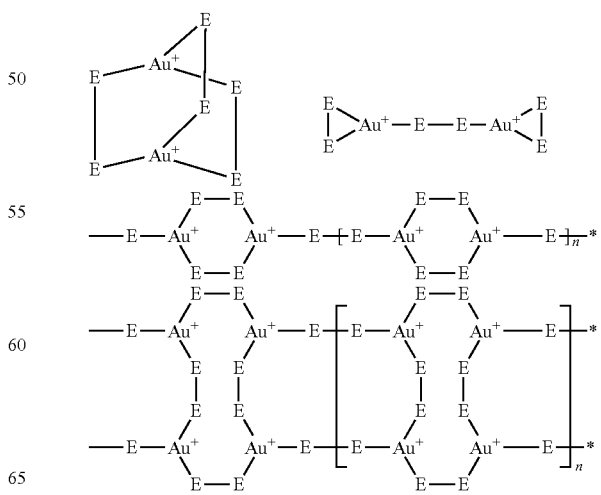

E-E represents a bisphosphine or -arsine with E=PR$_2$, PRR', AsR$_2$, AsRR'. Some examples for bisphosphines are shown further below. R and R' are defined below.

Subgroup A2:

Coordination of a bidentate and a monodentate ligand results in either mono-, or di-, or polynuclear complexes. Particularly preferred are phosphine or arsine ligands. Only the cations (without anion) are shown below.

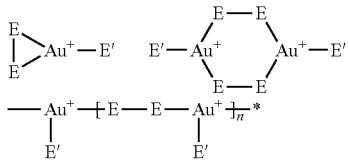

E-E represents a bisphospine or -arsine with E=PR$_2$, PRR', AsR$_2$, AsRR', E' represents a monophosphine or -arsine with E'=PR$_3$, PR$_2$R', PRR'R", AsR$_3$, AsR$_2$R', AsRR'R". R, R' and R" are defined below.

Subgroup A3:

Coordination of a tridentate ligand results in either mono-, or di-, or polynuclear complexes. Particularly preferred are again phosphine or arsine ligands:

Only the cations are shown below.

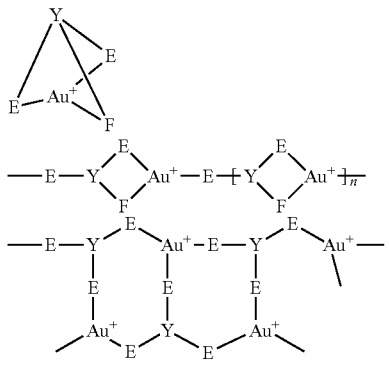

Y represents a branching point; E a phosphine- or arsine radical with E=PR$_2$, PRR', AsR$_2$, AsRR'. R and R' are defined below. Examples for tridentate phosphine- and arsine ligands are:

Y=HC, N

HC[(CH$_2$)$_n$PPh$_2$]$_3$, N[(CH$_2$)$_n$PPh$_2$]$_3$, HC[(CH$_2$)$_n$AsPh$_2$]$_3$, N[(CH$_2$)$_n$AsPh$_2$]$_3$, n=0, 1-20, preferably n=1, 2, 3, 4, 5; Ph=phenyl.

Group B: Neutral Complexes of Formula (III)

Subgroup B1:

L-L forms a bidentate, neutral ligand. Examples for this ligand are bidentate phosphines, arsines, isonitriles, thioethers, or selenoethers. Particularly preferred are bisposphines (see below) and bisarsines. L' is a monoanionic monodentate ligand such as for example Cl$^-$, Br$^-$, I$^-$, SCN$^-$, RS$^-$, RSe$^-$, RC≡C$^-$, RC=CH$^-$, RCH$_2^-$, RR'CH$^-$, R$_3$C$^-$, RC=CH$^-$, CN$^-$, Aryl$^-$.

Aryl$^-$ is preferably C$_6$H$_5^-$, C$_6$F$_5^-$; R$_3$C$^-$ is preferably F$_3$C$^-$.

The following coordination patterns may arise, if, for example, a bisphosphine or -arsine (with E=PR$_2$, PRR', AsR$_2$, AsRR') is used and L' represents one of the above depicted anionic ligands.

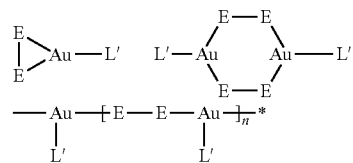

The following examples further illustrate this class of compound:

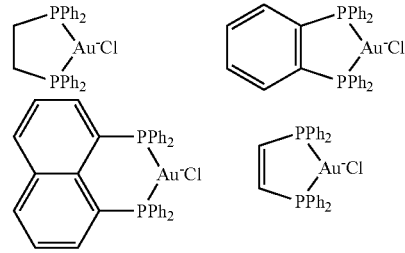

Subgroup B2:

L-L is a bidentate, monoanionic ligand, such as, for example, a bidentate phosphine, arsine, isonitrile, thioether, or selenoether. Particularly preferred are bisphosphines and bisarsines (see below). L' is a neutral, monodentate ligand such as, for example, phosphine PR$_3$, PR$_2$R', PRR'R", arsine AsR$_3$, AsR$_2$R', AsRR'R", isonitrile RNC, thioether R—S—R', selenoether R—Se—R'L'. Particularly preferred are in each case phosphines and arsines.

Preferred, monoanionic bisphosphines are, for example:

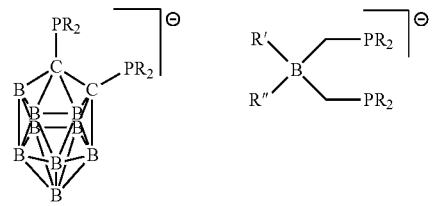

The bond to the central ion is achieved via P-atoms.

Examples for gold complexes of this subgroup are the compounds [Au(dipnc)(PPh$_3$)] and [Au(dppnc)(PPh$_3$)], whose structures are shown in FIG. 2 and whose physical properties are specified in the section "examples" as well as the FIGS. 3 to 5.

Subgroup B3:

L' is bound to L-L and forms a tridentate, monoanionic ligand L-L-L', such as for example a tridentate phosphine, arsine, isonitrile, thioether, selenoether. Particularly preferred are triphosphines and triarsines (see below).

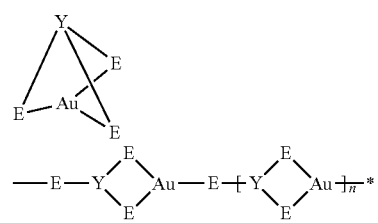

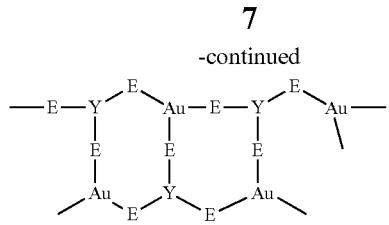

Y represents a branching point, which is preferably negatively charged; E a phosphine- or arsine radical with E=PR$_2$, PRR', AsR$_2$, AsRR'. Examples for tridentate phosphine- and arsine ligands are: Y=R'B  {R'B[(CH$_2$)$_n$PPh$_2$]$_3$}$^-$, {R'B [(CH$_2$)$_n$AsPh$_2$]$_3$}$^-$ n=1-20, preferably n=1, 2, 3, 4, 5

DEFINITIONS

Substitutents R; R' and R":

The substituents R, R' and R" contained in the substances depicted above may be, each independently: hydrogen, halogen or substituents, which are bound via oxygen or nitrogen (for example, —OR''', —NR'''2, R''' defined like R, R' and R"), as well as alkyl-, aryl-, heteroaryl- alkenyl-, alkynyl-, trialkylsilyl- and triarylsilyl groups and substituted alkyl-, aryl- heteroaryl- and alkenyl groups with substituents such as halogens and lower alkyl groups respectively. The groups R, R' and R" may also contain functions, which are able to perform polymerisation reactions (for example vinyl groups, epoxides, cyclic ethers), polyaddition reactions (for example, cyanates/alcohols=>polyurethanes), polycondensation reactions (carboxylates/amines=>polyamide and polyester respectively), "click-reactions" (combination alkyne/organic azide), or coupling reactions (for example, aryl halides/organo boronic acid, or halide/olefin). The group R, R' and R" may also be fluorinated in order to increase the volatility of the compound. The groups R, R' and R" may also comprise sulfonate (—SO$_3$H), phosphonate (—PO$_3$H$_2$) and carboxylate (—CO$_2$H) functions in order to obtain water-soluble compounds.

If not specified otherwise, the term "alkyl-" indicates, as used herein, each independently a C$_1$-C$_{30}$ preferably a C$_1$-C$_{20}$, and particularly a C$_1$-C$_6$ hydrocarbon group. The hydrocarbon groups can be linear or branched, and can be saturated or comprising one or more C=C double bonds or C≡C triple bonds.

The term "aryl-" indicates an aromatic system containing 5 to for example 20 C-atoms, particularly 6 to 10 C-atoms, wherein, if applicable, one or more C-atoms can be substituted by heteroatoms (for example by N, S and/or O).

Examples for bidentate phosphine ligands are the following (R can be different or identical and is defined as above):

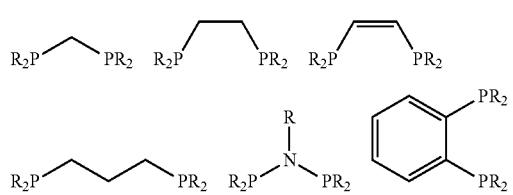

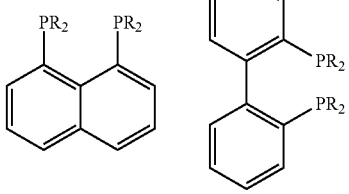

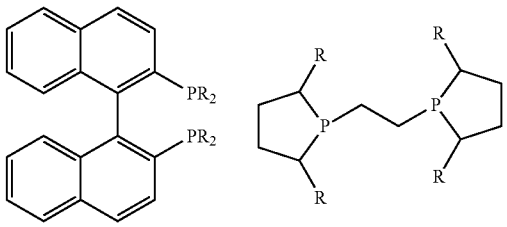

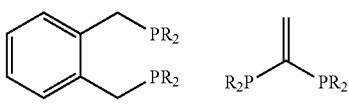

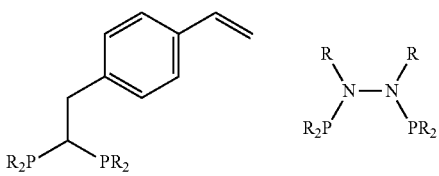

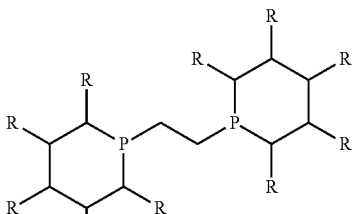

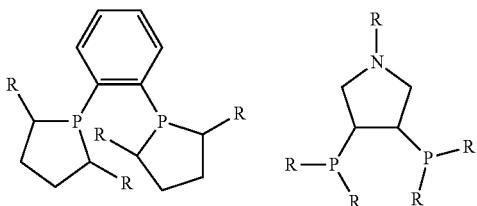

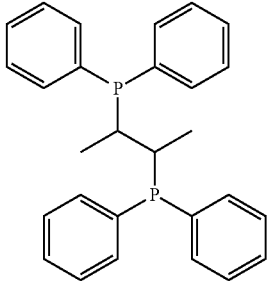

-continued

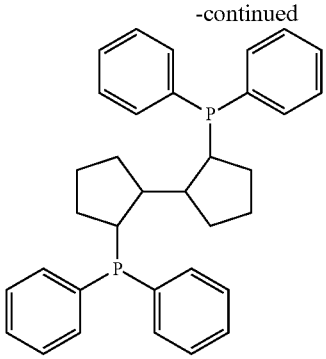

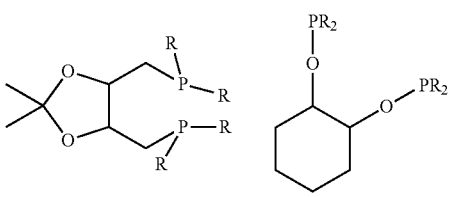

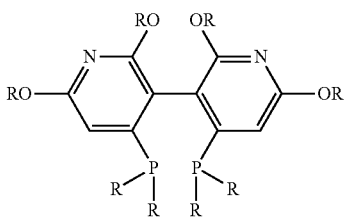

The invention is further described by the figures and the subsequent examples.

FIG. 1 shows a simplified representation of the way in which an OLED functions in a diagram.

Figure 5:
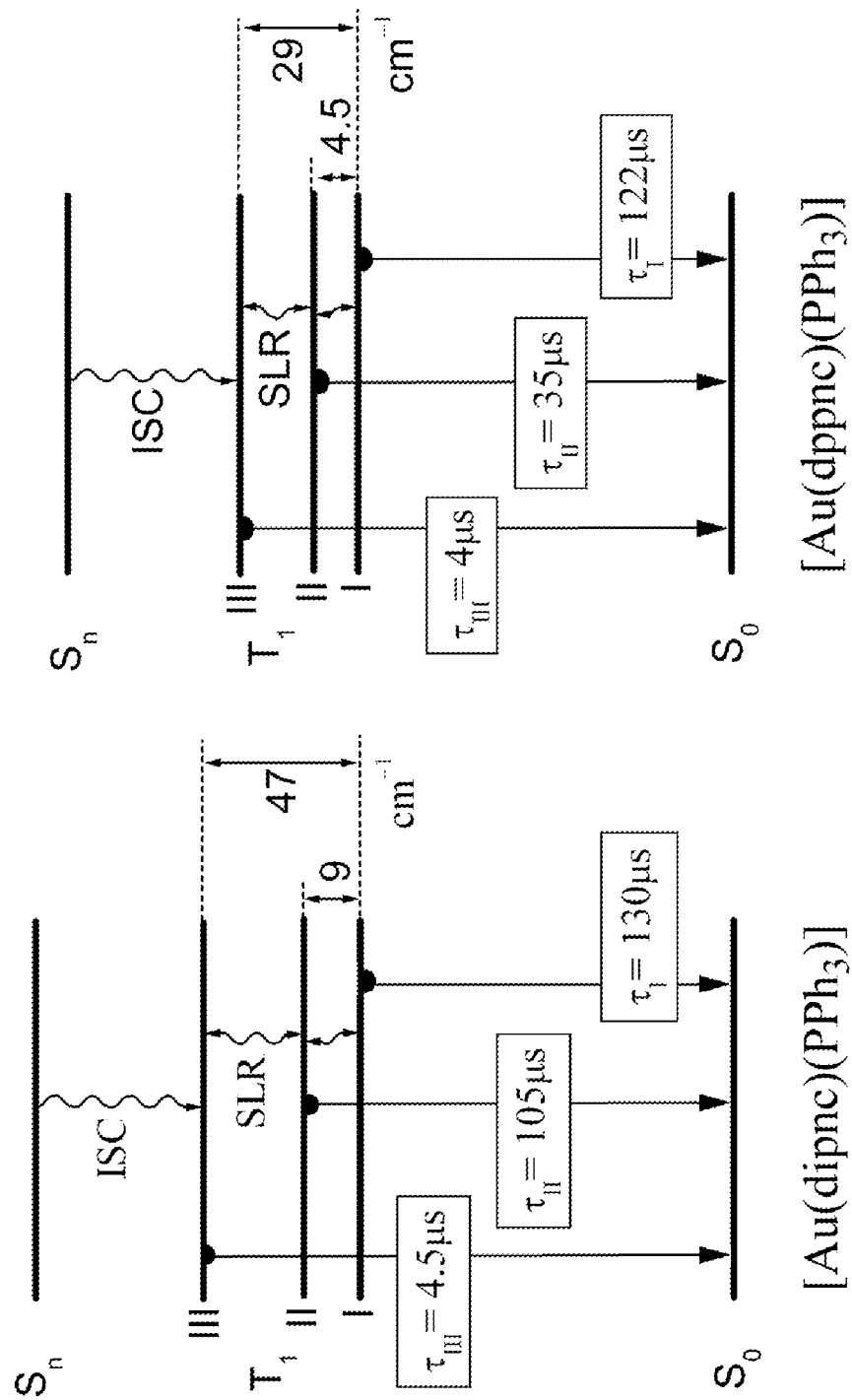

FIG. 5 shows energy level diagrams with emission decay times for the three lowest triplet sublevels of [Au(dipnc)(PPh$_3$)] and [Au(dppnc)(PPh$_3$)] in 2-methyltetrahydrofuran. ISC and SLR mean "inter-system crossing" and "spin-lattice relaxation" processes, respectively, which are responsible for the population of the T$_1$ sublevels and the thermal balance in-between them. These terms are known to those skilled in the art.

FIG. 1 diagrammatically shows the functioning of one embodiment of an OLED. The device comprises at least one anode, one cathode and one emitter layer.

Advantageously, one or both of the electrodes used as cathode or anode are transparent, enabling the light to be emitted through this electrode. The transparent electrode material used is preferably indium tin oxide (ITO). The use of a transparent anode is particularly preferred. The other electrode can likewise be of transparent material, but may also be formed from another material having a suitable electron work function if light is only to be emitted through one of the two electrodes. The second electrode, in particular the cathode, preferably consists of a metal of high electrical conductivity, for example aluminum or silver, or an Mg/Ag or Ca/Ag alloy.

An emitter layer is arranged between the two electrodes. This can be in direct contact or indirect contact with the anode and the cathode, where indirect contact means that further layers are present between the cathode or anode and the emitter layer, so that the emitter layer and the anode and/or cathode do not touch one another, but instead are in electrical contact with another via further interlayers. Upon application of a voltage, for example a voltage of 2-20 V, in particular 5-10 V, negatively charged electrons are emitted from the cathode, for example a conductive metal layer, preferably from an aluminum cathode, and migrate in the direction of the positive anode. Positive charge carriers, so-called holes, in turn migrate from this anode in the direction of the cathode. In accordance with the invention, the emitter layer arranged between the cathode and anode comprises gold complexes of the formula (I), particularly of the formula (II) or (III) as emitters. The migrating charge carriers, i.e. a negatively charged electron and a positively charged hole, recombine at the emitter complexes or in their vicinity and result in neutral, but energetically excited states of the emitter substances. The excited states of the emitters then release the energy as light emission.

The light emitting devices according to the invention can be manufactured using vacuum deposition, as far as the emitter materials sublimate. The manufacture using wet-chemical application is optionally also possible, for example by spin-coating methods, by inkjet-printing methods or by screen-printing methods. The assembling of OLED devices is described, for example, in US 2005/0260449 A1 and WO 2005/098988 A1.

The light emitting devices of the invention can be produced using vacuum sublimation and can contain several layers, particularly an electron injection layer and an electron transport layer (for example, Alq$_3$=aluminum-8-hydroxychinolin or β-Alq=aluminum-bis(2-methyl-8-hydroxychinolato)-4-phenylphenolate) and/or a hole injection (for example CuPc=copper phthalocyanine) and hole transport layer (for example, α-NPD=4,4''-bis[N-(1-naphtyl)-N-phenylamino)biphenyl]). However, it is also possible, that the emitter layer assumes functions of the hole transfer layer and electron transfer layer, respectively.

The emitter layer preferably consists of an organic matrix material with sufficiently high singlet S$_0$- triplet T$_1$-energy difference (matrix material), for example PVC (poly vinyl carbazole), CBP (4,4'-bis(9-carbazolyl)biphenyl) or other matrix materials. The emitter complex may be doped into this matrix material, for example, with 1 to 100 weight %, particularly with 3 to 20 weight %. The application with 100 weight % means that the appropriate complex is applied in pure form (100%). For example, measured at 300 K, the emission quantum yield for 100% [Au(dipnc)(PPh$_3$)] is just as the emission quantum yield in a PMMA film with a complex concentration of about one weight percent (70±15) %.

EXAMPLES

Complexes:

Example 1

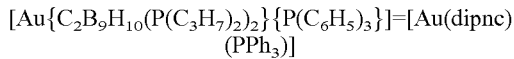
[Au{C$_2$B$_9$H$_{10}$(P(C$_3$H$_7$)$_2$)$_2$}{P(C$_6$H$_5$)$_3$}]=[Au(dipnc)(PPh$_3$)]

Example 2

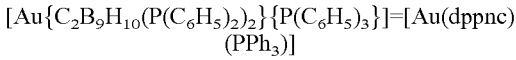
[Au{C$_2$B$_9$H$_{10}$(P(C$_6$H$_5$)$_2$)$_2$}{P(C$_6$H$_5$)$_3$}]=[Au(dppnc)(PPh$_3$)]

Figure 2:
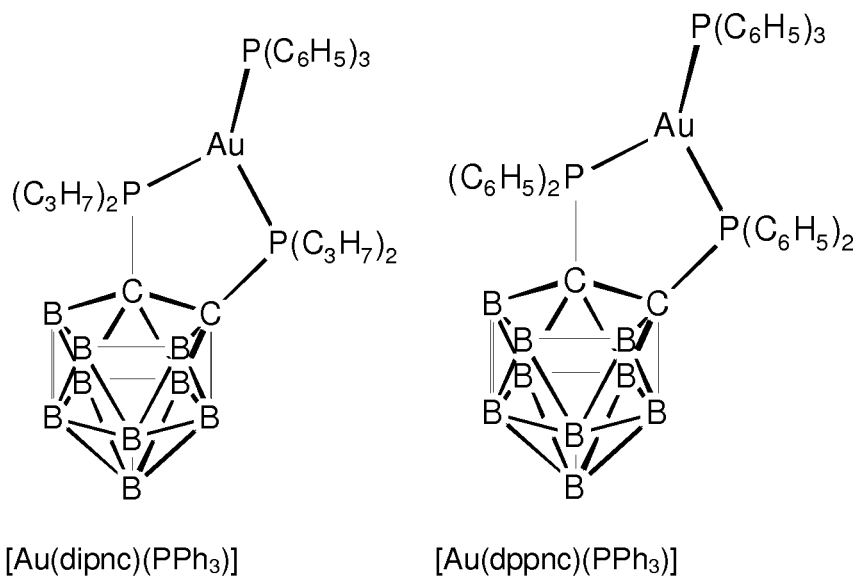
FIG. 2 shows the structural formula of the gold complexes of formula (I) of the invention, which are described in the examples. i-Pr=isopropyl, Ph=phenyl.

The structures of these compounds are depicted in FIG. 2.

Synthetic Pathway:

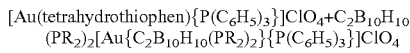
[Au(tetrahydrothiophen){P(C$_6$H$_5$)$_3$}]ClO$_4$+C$_2$B$_{10}$H$_{10}$(PR$_2$)$_2$[Au{C$_2$B$_{10}$H$_{10}$(PR$_2$)$_2$}{P(C$_6$H$_5$)$_3$}]ClO$_4$

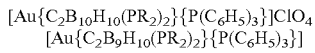
[Au{C$_2$B$_{10}$H$_{10}$(PR$_2$)$_2$}{P(C$_6$H$_5$)$_3$}]ClO$_4$
[Au{C$_2$B$_9$H$_{10}$(PR$_2$)$_2$}{P(C$_6$H$_5$)$_3$}]

R=Isopropyl (example 1) or phenyl (example 2)

The starting materials [Au(tetrahydrothiophen)(P(C$_6$H$_5$)$_3$]ClO$_4$ and C$_2$B$_{10}$H$_{10}$(PR$_2$)$_2$ can be synthesized according to literature [for example, Uson, R.; Laguna, A.; Laguna, M.; Jimenez, J.; Gomez, M. P.; Sainz, A.; Jones, P. G. *J. Chem. Soc., Dalton Trans.* 1990, 3457 and Alexander, R. P.; Schoeder, H. *Inorg Chem.* 1963, 26, 1107].

Figure 3:
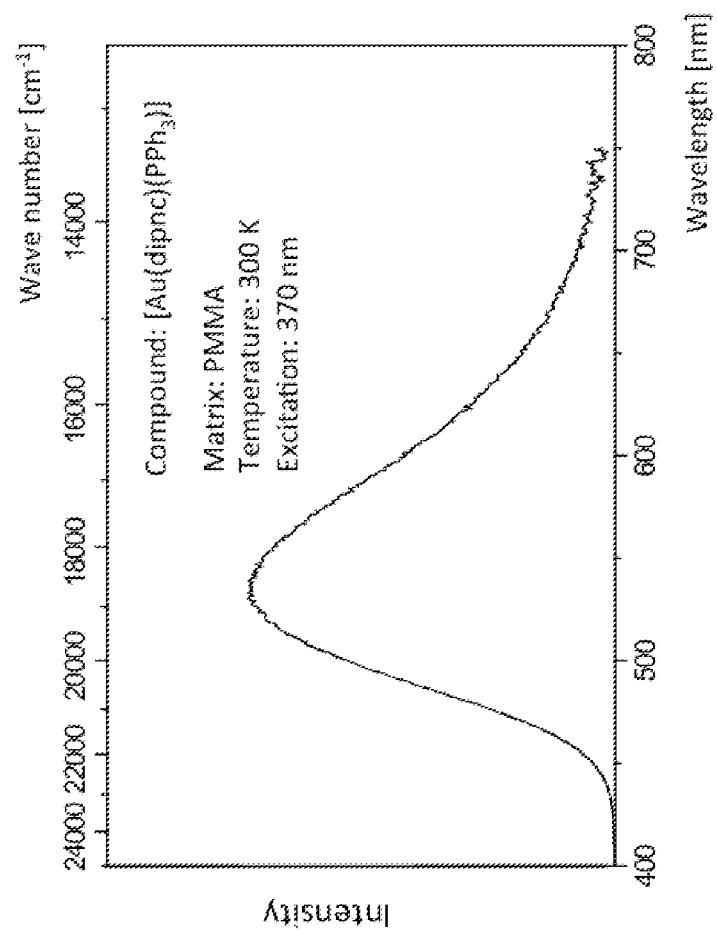
FIG. 3 shows the luminescence spectrum of [Au(dipnc)(PPh$_3$)].

Luminescence Spectra:

The luminescence spectrum of [Au(dipnc)(PPh$_3$)] is shown in FIG. 3.

Figure 4:
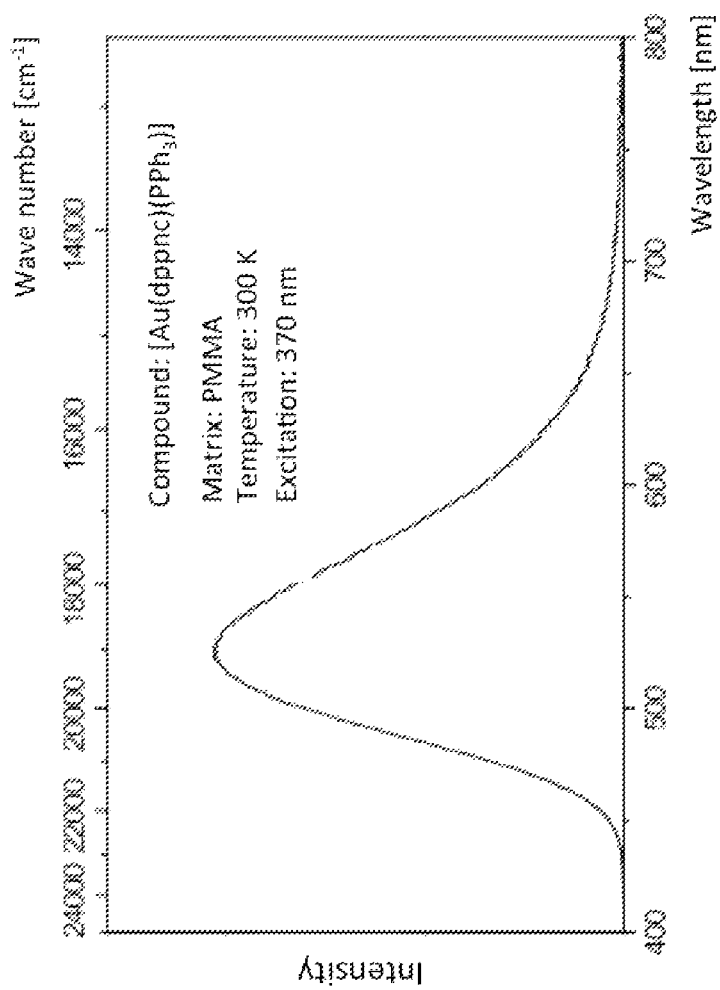
FIG. 4 shows the luminescence spectrum of [Au(dppnc)(PPh$_3$)].

The luminescence spectrum of [Au(dppnc)(PPh$_3$)] is shown in FIG. 4.

Luminescence Properties:

| Gold Complex: | [Au(dipnc)(PPh$_3$)] | [Au(dppnc)(PPh$_3$)] |
|---|---|---|
| $\lambda_{max}/\tau$ at 300 K | 525 nm/12 µs | 534 nm/8 µs |
| $\lambda_{max}/\tau$ at 77 K | 508 nm/20 µs | 497 nm/15 µs |
| $\phi_{PL}$ (300 K) | 75% | 50% |

$\lambda_{max}$ = Emission maximum and $\tau$ = emission decay time measured in a diluted 2-methyltetrahydrofuran solution
$\phi_{PL}$ = Photoluminescence quantum yield measured in PMMA (poly(methyl methacrylate)) at room temperature.

The invention claimed is:

1. A method for producing an optoelectronic device comprising the step of utilizing a gold complex having Formula (I)

[(L-L)(L')Au]$^{0/1+}$[Anion]$_{0/1}$  Formula (I)

wherein
(L-L) is a first ligand, which is bidentate,
(L') is a second ligand, which is mono- or bidentate,
Au is a gold(I) central ion, and
Anion is a counter anion, which is present for [(L-L)(L')Au]$^{1+}$.

2. The method of claim 1, wherein an electrically charged gold complex of formula (II) is utilized

[(L-L)(L')Au]$^{1+}$[Anion]  Formula (II).

3. The method of claim 1, wherein an electrically neutral gold complex of formula (III) is utilized

[(L-L)(L')Au]  Formula(III).

4. The method of claim 1, wherein the gold complex exhibits an emission decay time measured at T=300 K of 2 µs to 20 µs.

5. The method of claim 1, wherein the gold complex exhibits an emission quantum yield measured at T=300 K of at least 35%, at least 50%, at least 75%, or at least 95%.

6. An optoelectronic device comprising a gold complex of formula (I)

[(L-L)(L')Au]$^{0/1+}$[Anion]$_{0/1}$  Formula (I)

wherein
(L-L) is a first ligand, which is bidentate,
(L') is a second ligand, which is mono- or bidentate,
Au is a gold(I) central ion, and
Anion is a counter anion, which is present for [(L-L)(L')Au]$^{1+}$,
formula (II)

[(L-L)(L')Au]$^{1+}$[Anion]  Formula (II), or formula (III)

[(L-L)(L')Au]  Formula(III).

7. The optoelectronic device of claim 6, wherein the content of complexes of the formula (I), (II) or (III) in the emitter layer is 2 to 100 weight %, 3 to 20 weight %, or 100 weight % in relation to the total weight of the emitter layer.

8. The method of claim 1, comprising the step of utilizing a gold complex according to formula (I), (II) or (III).

9. The optoelectronic device of claim 6 comprising an organic electronic device, wherein the organic electronic device is selected from the group consisting of:
  organic light emitting diodes (OLEDs),
  light-emitting electrochemical cells (LEECs),
  OLED sensors,
  organic solar cells (OSCs),
  organic field-effect transistors,
  organic lasers,
  organic photo diodes, and
  organic diodes.

10. The optoelectronic device of claim 9 in the form of an organic solar cell, wherein the content of the gold complex according to formula (I), (II) or (III) in the absorption layer is 2 to 100 weight %, in relation to the total weight of the absorption layer.

11. The optoelectronic device of claim 10 wherein the content of the gold complex according to formula (I), (II) or (III) in the absorption layer is 30 to 100 weight % in relation to the total weight of the absorption layer.

12. The method of claim 4, wherein the gold complex exhibits an emission decay time measured at T=300 K of 2 µs to 15 µs.

13. The optoelectronic device of claim 9, wherein the OLED sensor is a gas sensor or a vapor sensor that is not hermetically screened from the outside.

14. The optoelectronic device of claim 9, wherein the organic solar cell is an organic photovoltaic (OPV).

15. The method of claim 1, wherein the optoelectronic device comprises an organic electronic device, and wherein the organic electronic device is selected from the group consisting of:
  organic light emitting diodes (OLEDs),
  light-emitting electrochemical cells (LEECs),
  OLED sensors, organic solar cells (OSCs),
  organic field-effect transistors,
  organic lasers,
  organic photo diodes, and
  organic diodes.

16. The method of claim 15, wherein the OLED sensor is a gas sensor or a vapor sensor that is not hermetically screened from the outside.

17. The method of claim 15, wherein the organic solar cell is an organic photovoltaic (OPV).

18. The method of claim 8, wherein the optoelectronic device comprises an organic electronic device, and wherein the organic electronic device is selected from the group consisting of:
- organic light emitting diodes (OLEDs),
- light-emitting electrochemical cells (LEECs),
- OLED sensors, organic solar cells (OSCs),
- organic field-effect transistors,
- organic lasers,
- organic photo diodes, and
- organic diodes.

19. The method of claim 18, wherein the OLED sensor is a gas sensor or a vapor sensor that is not hermetically screened from the outside.

20. The method of claim 18, wherein the organic solar cell is an organic photovoltaic (OPV).

* * * * *